United States Patent

Katayanagi et al.

[11] Patent Number: 5,952,887
[45] Date of Patent: Sep. 14, 1999

[54] FEEDBACK AMPLIFIER AND OPTICAL RECEIVER USING THE SAME

[75] Inventors: Tetsuo Katayanagi; Nobuo Kobayashi, both of Tokyo, Japan

[73] Assignee: Oki Electric Industry Co., Ltd., Tokyo, Japan

[21] Appl. No.: 09/030,834

[22] Filed: Feb. 26, 1998

[30] Foreign Application Priority Data

Feb. 27, 1997 [JP] Japan ..................... 9-043911

[51] Int. Cl.⁶ ............... H03F 3/08; H03F 1/36; H04B 10/06
[52] U.S. Cl. .............. 330/308; 330/110; 359/189
[58] Field of Search .................. 330/308, 110; 250/214 A, 214 LA; 359/189

[56] References Cited

U.S. PATENT DOCUMENTS 5,777,517  7/1998  Seshita ........................ 330/277
5,821,814  10/1998  Katayama et al. .............. 330/277

FOREIGN PATENT DOCUMENTS 57-194613  11/1982  Japan.

Primary Examiner—Robert Pascal
Assistant Examiner—Patricia Nguyen
Attorney, Agent, or Firm—Wenderoth, Lind & Ponack, L.L.P.

[57] ABSTRACT

A feedback amplifier includes an input terminal where an input voltage is detected from an input current; an amplifier circuit which amplifies the input voltage to generate an output signal; a first output terminal from which the output signal is outputted; and a feedback circuit. The feedback circuit includes a feedback resistor connected between the input terminal and the first output terminal; and a diode which connected in parallel to the feedback resistor. The output signal is feedback-controlled in response to the product of the input current and the impedance of the feedback circuit.

8 Claims, 5 Drawing Sheets

5,952,887

FEEDBACK AMPLIFIER AND OPTICAL RECEIVER USING THE SAME

CROSS REFERENCE TO RELATED APPLICATION

This application claims the priority of Application No. H09-043911, filed Feb. 27, 1997 in Japan, the subject matter of which is incorporated herein by reference.

TECHNICAL FIELD OF THE INVENTION

The present invention relates to a feedback amplifier and an optical receiver using the same, and more particularly to, a feedback amplifier used as a pre-amplifier in an optical receiver for a high-speed optical communication system.

BACKGROUND OF THE INVENTION

A conventional feedback amplifier is described in Japanese Patent Laying Open, Kokai No. S57-194613. The feedback amplifier includes an amplifier circuit which amplifies an input signal to provide an output voltage signal. The feedback amplifier is also provided with a feedback circuit to control the level of the output voltage signal. The feedback circuit includes a feedback resistor connected between an input terminal and an output terminal, and a transistor connected in parallel with the feedback resistor. The transistor is applied at the base with a control signal. In response to the control signal, a feedback current flowing through the feedback circuit is controlled, so that the output voltage is controlled.

In the conventional feedback amplifier, to broaden the dynamic range of feedback control, it is required that the control signal is determined based on the input current not to saturate the output voltage. The control signal has to be supplied from an external circuit.

OBJECTS OF THE INVENTION

Accordingly, it is an object of the invention to provide a feedback amplifier in which the dynamic range is easily controlled without using an external circuit.

Another object of the invention is to provide an optical receiver using a pre-amplifier in which the dynamic range is easily controlled without using an external circuit.

Additional objects, advantages and novel features of the invention will be set forth in part in the description that follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

First Aspect of the Invention

According to a first aspect of the invention, a feedback amplifier (20) includes an input terminal (IN) where an input voltage is detected from an input current (in); an amplifier circuit (21) which amplifies the input volltage to generate an output signal (S20); a first output terminal (OUT) from which the output signal (S20) is outputted; and a feedback circuit (23). The feedback circuit (23) includes a feedback resistor (23a) connected between the input termninal (IN) and the first output terminal (OUT); and a diode (23b) which connected in parallel to the feedback resistor (23a). The output signal (S20) is feedback-controlled in response to the product of the input current; (in) and the impedance of the feedback circuit (23).

The above described feedback amplifier (20) may further include, an output circuit (22) connected between the amplifier circuit (21) and the first output terminal (OUT). In this case, the amplifier circuit (21) may include a first transistor (21a), connected at the gate to the input terminal (IN) and at the source to ground; and a second transistor (21b), connected at the gate and source to the drain of the first transistor (21a) and at the drain to a power supply (Vdd). The output circuit (22) may include a third transistor (22a) connected at the gate to the gate and source of the second transistor (21b), at the drain to the power supply (Vdd) and at the source to the first output terminal (OUT); and a fourth transistor (22d) connected at the gate and source to ground and at the drain to the first output terminal (OUT).

In the feedback amplifier (20) of the first aspect of the invention, if the input current (in) is small, a low level voltage is applied to the diode (23b), so that the impedance of the diode (23b) is very large relative to the feedback resistor (23a), and therefore, it can be considered that the diode (23b) is in an open state. As a result, the output voltage (S20) becomes almost identical to the product of the resistance of the feedback resistor (23a) and the input current (in). On the other hand, if the input current (in) is increased, the voltage applied to the diode (23b) is also increased, so that the current flowing through the diode (23b) is increased, and the impedance of the diode (23b) is decreased. As a result, the impedance of the feedback circuit (23) is decreased in response to the increase of the input current (in), and therefore, the output voltage (S20) is almost identical to the product of the input current (in) and the impedance of the diode (23b).

Consequently, it is not required to provide a gain control circuit outside the amplifier (20), because the diode (23b) is connected in parallel to the feedback resistor (23a). As a result, the impedance of the feedback circuit (23) can be reduced when the input current (in) is increased, so that the feedback amplifier (20) can operate in a wide dynamic range.

Second Aspect of the Invention

According to a second aspect of the invention, a feedback amplifier (20A) includes, in addition to the feedback amplifier (20) of the first aspect of the invention, a second output terminal (N); and an output level shifter (22A) which shifts the level of the output signal (S20A) to generate a shifted output signal supplied to the second output terminal (N). The diode (23b) is connected between the input terminal (IN) and the second output terminal (N) and is forward-biased.

In the feedback amplifier (20A) of the second aspect of the invention, the amplifier circuit (21) may include a first transistor (21a), connected at the gate to the input terminal (IN) and at the source to ground; and a second transistor (21b), connected at the gate and source to the drain of the first transistor (21a) and at the drain to a power supply (Vdd). The output level shifter (22A) may include a third transistor (22a) connected at the gate to the gate and source of the second transistor (21b), at the drain to the power supply (Vdd) and at the source to the first output terminal (OUT); a resistor (22e) connected at one end to the source of the third transistor (22a) and the first output terminal (OUT), and at the other end to the second output terminal (N); and a fourth transistor (22d) connected at the gate and source to the ground and at the drain to the second output terminal (N).

According to the feedback amplifier of the second aspect of the invention, the diode (23b) is forward-biased, even though no input current is inputted. As a result, if the input current (in) is increased, the gain of the output voltage (S20A) starts being decreased from an amplitude that is lower than that of the first aspect of the invention. Consequently, the feedback amplifier (20A) can operate in a wider dynamic range as compared to the first aspect of the invention.

Third Aspect of the Invention

According to a third aspect of the invention, a feedback amplifier (20B) includes, in addition to the feedback amplifier (20A) of the second aspect of the invention, an input level shifter (24) which is connected between the input terminal (IN) and the amplifier circuit (21A) to shift the input voltage to a predetermined level. The amplifier circuit (21A) amplifies the shifted input voltage.

In the feedback amplifier (20B) of the third aspect of the invention, the input level shifter (24) may include a fifth transistor (24a) connected at the gate to the input terminal (IN) at a drain to the power supply (Vdd) and at the source to the gate of the first transistor (21a); and a sixth transistor (24e) connected at the gate and source to the ground, and at the drain to the source of the fifth transistor (24a).

According to the feedback amplifier (20B) of the third aspect of the invention, the voltage at the input terminal (IN) is shifted by the input level shifter (24) and is supplied to the amplifier circuit (21A). As a result, a voltage (potential) of each signal in the feedback amplifier (20B) is lowered relative to the ground level, so that the feedback amplifier (20B) can operate with a power supply of lower voltage.

Another Aspect of the Invention

According to another aspect of the invention, an optical receiver includes a photodiode (PD) which detects an input light signal to generate an input current (in); and a feedback type of pre-amplifier (20, 20A, 20B) according to the first to third aspects of the invention.

DETAILED DISCLOSURE OF THE INVENTION

Figure 1:
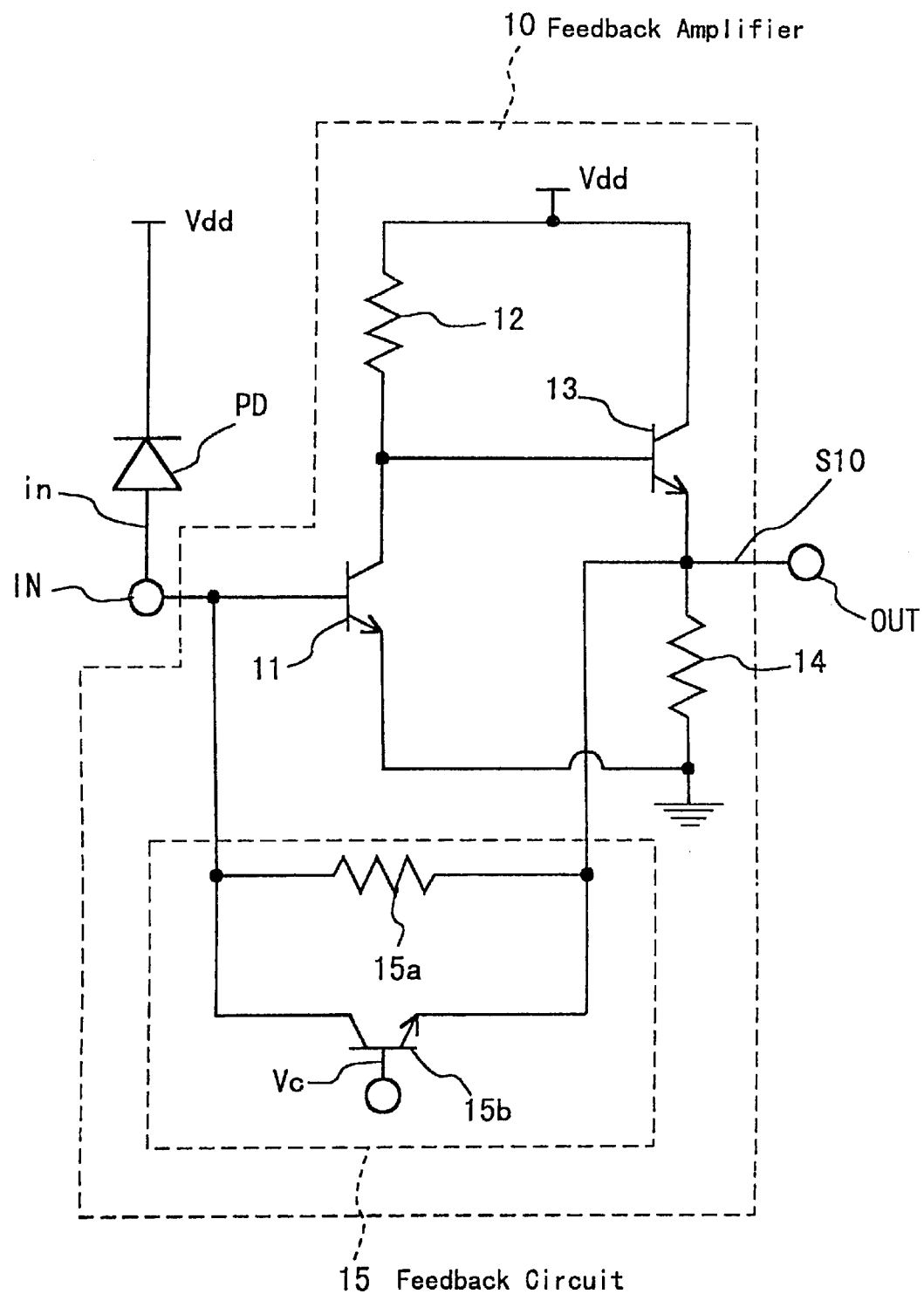
FIG. 1 is a circuit diagram illustrating a conventional feedback amplifier.

For better understanding of the invention, background technology is first described. FIG. 1 shows a conventional feedback amplifier 10, which described in Japanese Patent Laying Open Kokai No. S57-194613. The feedback amplifier 10 is connected between an input terminal IN and an output terminal OUT. It can be said that the feedback amplifier 10 includes those terminals. The input terminal IN is connected to a photodiode (light receiving device) PD, which is connected to a power supply Vdd. An input current "in," corresponding to a cathode current of the photodiode PD, is supplied to the input terminal IN.

The input terminal IN is connected to the base of an NPN type transistor 11. The collector of the transistor 11 is connected through a resistor 12 to the power supply Vdd, and to the base of an NPN type transistor 13. The collector of the transistor 13 is connected to the power supply Vdd. The emitter of the transistor 13 is connected to an output terminal OUT and to ground through a resistor 14. The emitter of the transistor 11 is grounded.

The output terminal OUT is connected to the base of the transistor 11 through a resistor 15a in a feedback circuit 15. The emitter of a transistor 15b in the feedback circuit 15 is connected to the output terminal OUT, while the collector of the transistor 15b is connected to the base of the transistor 11. A control signal Vc is applied to the base of the transistor 15b from an external circuit (not shown) to control a feedback current.

When a feedback amplifier is used as a pre-amplifier in an optical receiver, a transimpedance amplifier is employed, as shown in FIG. 1. In the transimpedance amplifier, the collector-grounded circuit with the transistor 13 is connected to the emitter-grounded circuit with the transistor 11, and an output signal S10 of the collector-grounded circuit is fed back through the feedback circuit 15 to the input side of the emitter-grounded circuit (the base of the transistor 11).

In the feedback amplifier 10, the cathode current of the photodiode PD is converted into a voltage signal, so that the ratio of the output voltage S10 to the input current "in" becomes a parameter (hereinafter called "transimpedance") showing the efficiency of the feedback amplifier 10. The transimpedance is almost identical to the resistance of the feedback circuit 15. Thus, the transimpedance of the resistor 15 a can be controlled based on the impedance of the resistor 15a between the collector and emitter, changed in response to the control signal Vc.

Next, the operation of the feedback amplifier 10, shown in FIG. 1, will be described. When the control signal Vc of a low voltage is applied to the base of the transistor 15b, the transistor 15b is in an off state, so that the impedance between the collector and emitter of the transistor 15b becomes high enough. Therefore, it can be considered that the transistor 15b is equivalent to opened, and the transimpedance becomes almost identical to the resistance of the resistor 15a.

After that, when the control signal Vc goes up, the transistor 15b turns on, and therefore, the impedance between the collector and emitter of the transistor 15b is decreased. As a result, the feedback resistance is equivalently reduced, and the transimpedance is decreased. Accordingly, the gain of the feedback amplifier 10 is controlled in response to the control signal Vc. In the feedback amplifier 10, when the control signal Vc is changed in response to the input current "in," the gain of the output voltage S10 can be controlled not to be saturated, and therefore, the dynamic range can be broadened.

In the conventional feedback amplifier 10, shown in FIG. 1, to broaden the dynamic range of feedback control, it is required that the control signal Vc is determined in response to the input current "in" not to saturate the output voltage S10. The control signal Vc has to be supplied from in external circuit.

First Preferred Embodiment

Figure 2:
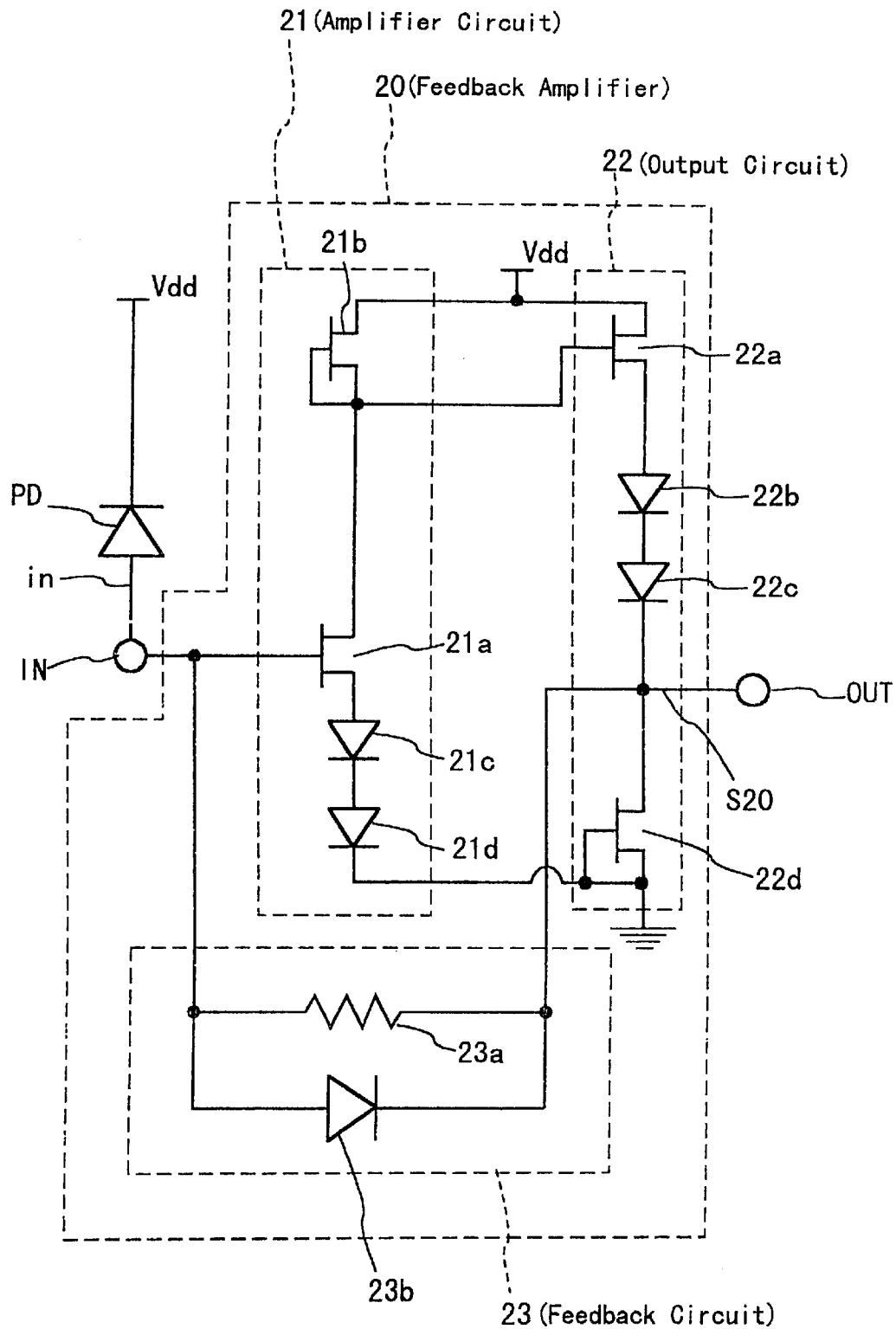
FIG. 2 is a circuit diagram illustrating a feedback amplifier according to a first preferred embodiment of the invention.

FIG. 2 shows a feedback amplifier 20 according to a first preferred embodiment of the invention. The feedback amplifier 20 is provided with an input terminal IN to which a cathode current of a photodiode PD is supplied as an input current "in." The input terminal IN is connected to a power supply Vdd via the photodiode PD. The feedback amplifier 20 includes an amplifier circuit 21, an output circuit 22 and a feedback circuit 23. The amplifier circuit 21 includes first and second FETs (Field Effect Transistor) 21a and 21b, and diodes 21c and 21d. The output circuit 22 includes third and fourth FETs 22a and 22d, and diodes 22b and 22c. The feedback circuit 23 includes a feedback resistor 23a, which is connected between the input terminal IN and an output terminal OUT, and a diode 23b connected in parallel with the feedback resistor 23a.

In the amplifier circuit 21, the first FET 21a is connected at the gate to the input terminal IN. The drain of the first FET 21a is connected to the source and gate of the second FET 21b. The drain of the second FET 21b is connected to the power supply Vdd. The source of the first FET 21a is connected to ground through diodes 21c and 21d, serially connected in the forward direction. The amplifier circuit 21 is designed to amplify the voltage at the input terminal IN. The drain of the first FET 21a is connected to the gate of the third FET 22a in the output circuit 22.

In the output circuit 22, the drain of the third FET 22a is connected to the power supply Vdd. The source of the third FET 22a is connected to the output terminal OUT through the diodes 22b and 22c, serially connected in the forward direction. The third FET 22a is also connected at the source to the drain of the fourth FET 22d through the diodes 22b and 22c. The source and gate of the fourth FET 22d are connected to ground. The drain of the fourth FET 22d and the source of the first FET 21a have almost the same voltage, so that the drain-source voltage of the fourth FET 22d is determined based on a voltage drop of the serially connected diodes 21c and 21d. A drain-source voltage of the first FET 21a is determined based on a voltage drop of the serially connected diodes 22b and 22c. In the output circuit 22, an output voltage of the amplifier circuit 21 is outputted as an output signal S20 from the output terminal OUT.

The output terminal OUT is connected to the gate of the first FET 21a through the feedback resistor 23a in the feedback circuit 23. The feedback resistor 23a functions to determine a feedback current to be supplied to the input terminal IN. The cathode of the diode 23b in the feedback circuit 23 is connected to the output terminal OUT, and the anode of the diode 23b is connected to the gate of the first FET 21a. The diode 23b functions to control the feedback current, to be supplied to the input terminal IN, because the impedance thereof is changed in response to the input current "in." The output terminal OUT is connected to an amplifier (not shown).

Figure 3:
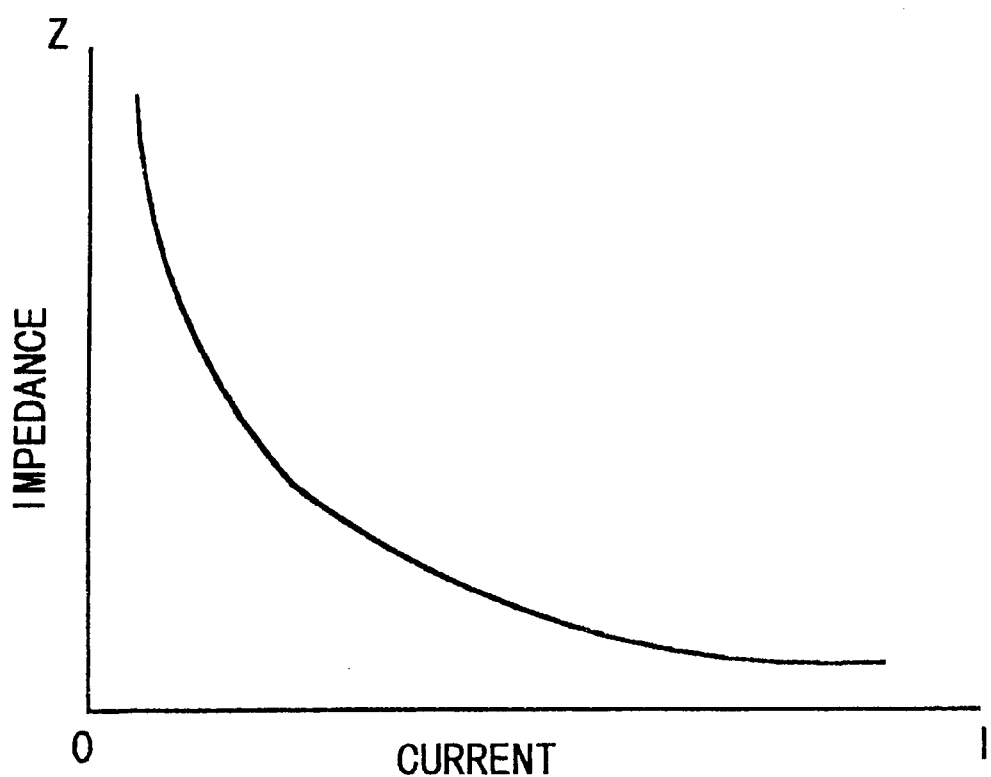
FIG. 3 is a graph showing the impedance of a diode 23b shown in FIG. 2.

FIG. 3 is a graph showing the variation of impedance of the diode 23b, in which the horizontal line and vertical line show current I and impedance Z. respectively. The impedance characteristic of the diode 23b is represented by the following equation (1):

$$Z = V/I = (nkT/qI)\ln(I/I_0) \tag{1}$$

I: Current Flowing through the Diode
V: Voltage Applied to the Diode
q: Electric Charge ($1.6 \times 10^{-19}$ (c))
k: Boltzmann's Constant
T: Absolute Temperature
n: Specific Value for Device
$I_0$: Saturation Current Density Next, the operation of the feedback amplifier 20 will be described. When the cathode current (input current "in") of the photodiode PD starts flowing in response to a light applied thereto, the gate voltage of the first FET 21a goes up and the drain current thereof is increased. In response to such operation, the current flowing through the second FET 21b is increased and the source voltage of the second FET 21b goes down. As a result, the gate voltage of the third FET 22a goes down. When the gate voltage of the third FET 22a goes down, the source voltage of the third FET 22a and the cathode voltage of the diodes 22b and 22c go down, and therefore, the output voltage S20 at the output terminal OUT goes down.

On the other hand, if the input current "in" is decreased, the opposite operation is performed to the above described operation, and therefore, the output voltage S20 goes up. Accordingly, the feedback amplifier 20 functions as an inverted amplifier in that the output voltage S20 changes in level in the opposite way to the gate voltage of the first FET 21a.

When a small amount of input current "in" is supplied, a low voltage is applied to the diode 23b, so that the diode 23b has impedance Z that is large enough relative to the resistance of the feedback resistor 23a. It can be considered that the diode 23b is in an open state, and can be ignored. As a result, the output voltage S20 becomes corresponding to the product of the resistance of the feedback resistor 23a and the input current "in."

On the other hand, when the input current "in" is increased, a high voltage is applied to the diode 23b, and the current flowing through the diode 23b is increased, and therefore, impedance of the diode 23b goes down, as shown in FIG. 3. As a result, the impedance of the feedback circuit 23 is decreased in response to the increase of the input current "in," so that the output voltage S20 corresponds to the product of the impedance of the diode 23b and the input current "in." Accordingly, the feedback amplifier 20 operates in a wide dynamic range, in which the output voltage S20 does not saturate even though the input current "in" is increased.

As described above, in the first preferred embodiment, it is not required with provide a gain control circuit outside the amplifier 20, because the diode 23b is connected in parallel to the feedback resistor 23a. The impedance of the feedback circuit 23 can be reduced when the input current "in" is increased, so that the feedback amplifier 20 can operate in a wide dynamic range.

Second Preferred Embodiment

Figure 4:
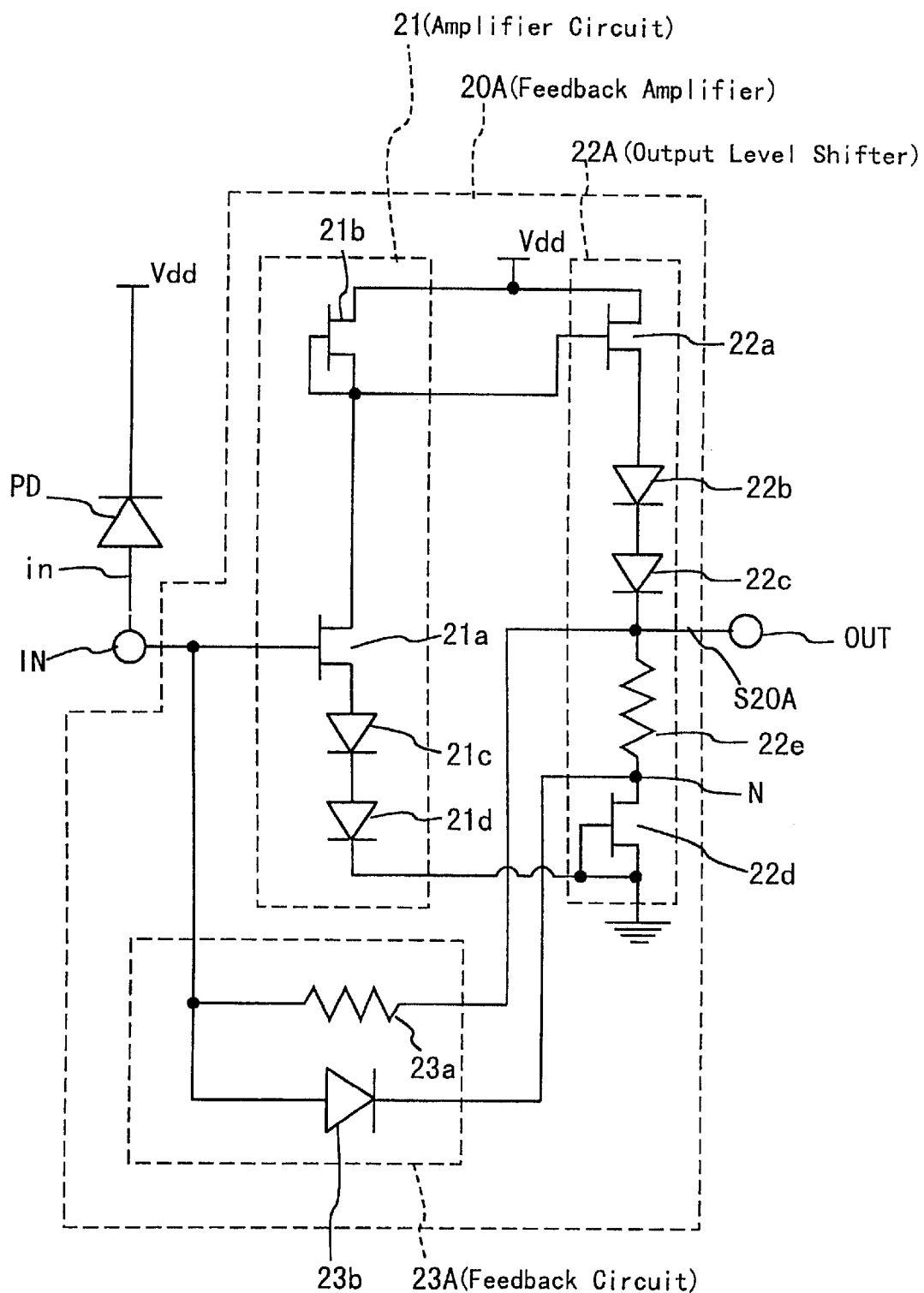
FIG. 4 is a circuit diagram illustrating a feedback amplifier according to a second preferred embodiment of the invention.

FIG. 4 shows a feedback amplifier 20A, according to a second preferred embodiment of the invention. In FIG. 4, the same or corresponding components to those in FIG. 2 are represented by the same symbols, and the same description of the first preferred embodiment is not repeated here in the second preferred embodiment to avoid redundant description. In other words, only the difference from the first preferred embodiment is described in detail.

The feedback amplifier 20A includes an amplifier circuit 21, an output level shifter 22A and a feedback circuit 23A. When comparing the first and second preferred embodiments, in the feedback amplifier 20A, the output level shifter 22A and the feedback circuit 23A are used in place of the output circuit 22 and the feedback circuit 23 of the first preferred embodiment, shown in FIG. 2. An output terminal OUT is connected to the gate of a first FET 21a through a feedback resistor 23a in the feedback circuit 23A. In the feedback circuit 23A, the cathode of a diode 23b is connected to a node N. The other structure is the same as the first embodiment shown in FIG. 1.

The feedback amplifier 20A is different in operation from the first embodiment, shown in FIG. 2, as follows:

The cathode of the diode 23b is connected to the node N having a lower voltage than the output terminal OUT, so that the a forward voltage is applied to the diode 23b even though the input current "in" does not exist. As a result, when the input current "in" is increased, the gain of an output voltage S20A having a smaller amplitude than the output voltage S20, shown in FIG. 2, can be reduced. Therefore, the feedback amplifier 20A can operate in a wider dynamic range.

Next, an electric potential (voltage) of each portion in the feedback amplifier 20A will be described.

In the feedback amplifier 20A, it is required that a power supply voltage Vdd meets the following formula (2):

Vdd>(Vds of FET 22d)+(Voltage drop of Resistor 22e)+(Vds of FET 21a)+(Vds of FET 21b)+Output Amplitude  (2)

Vds: Drain-Source Voltage

The power supply voltage Vdd can be shown by the following formula (3), because Vds of the second FET 21b and Vds of third FET 22a are almost identical to each other, and the minimum value of Vds of the first FET 21a corresponds to the voltage drop of the diodes 22b and 22c:

Vdd > (Vds of FET 22d) +  (3)

(Voltage drop of Resistor 22e) + (Vds of FET 21a) +

(Voltage drop of Diodes 22b and 22c) + Output Amplitude

As described above, according to the second preferred embodiment, the cathode of the diode 23b is connected to the node N (second output terminal) having a lower voltage than the output terminal OUT, so that the gain can be decreased from the output voltage S20A having a lower amplitude than the output voltage S20, in FIG. 2. As a result, the feedback amplifier 20A can operate, in response to the change of the input current "in," in a wider dynamic range as compared to the first preferred embodiment.

Third Preferred Embodiment

Figure 5:
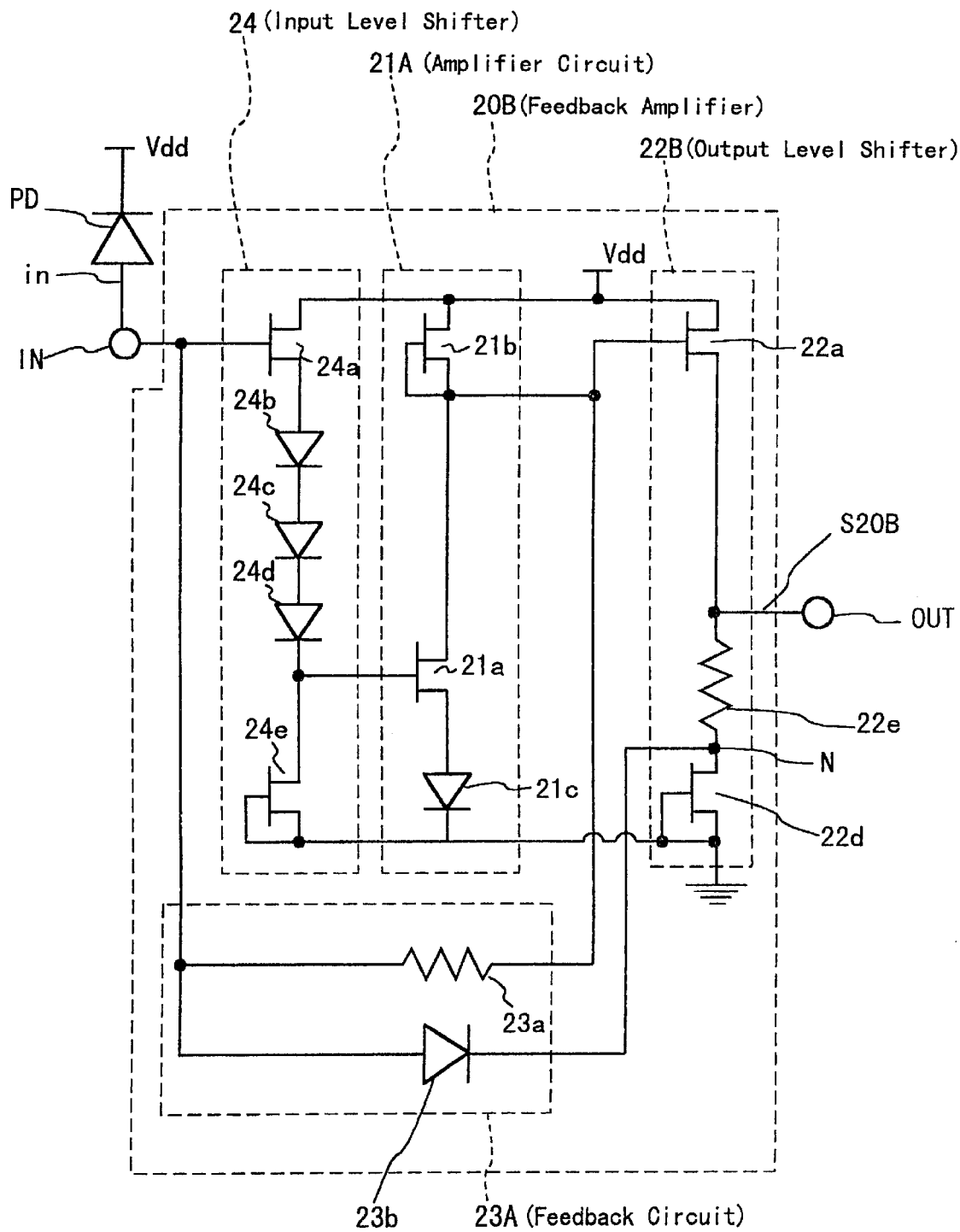
FIG. 5 is a circuit diagram illustrating a feedback amplifier according to a third preferred embodiment of the invention.

FIG. 5 shows a feedback amplifier 20B, according to a third preferred embodiment of the invention. In FIG. 5, the same or corresponding components to those in FIGS. 2 and 4 are represented by the same symbols, and the same description of the first and second preferred embodiments is not repeated here in the third preferred embodiment to avoid redundant description. In other words, only the difference from the second preferred embodiment is described in detail.

The feedback amplifier 20B includes an input level shifter 24, an amplifier circuit 21A, an output level shifter 22B and a feedback circuit 23A. In the feedback amplifier 20B, the amplifier circuit 21A and the output level shifter 22B are used in place of the amplifier circuit 21 and the output level shift unit 22A, shown in FIG. 4.

In the amplifier circuit 21A, the source of a first FET 21a is connected through a forward-connected diode 21c to ground. In the output level shifter 22B, the diodes 22b and 22c in the level shift unit 22A of the second preferred embodiment are omitted, and the source of a third FET 22a is connected to an output terminal OUT.

In the input level shifter 24, a fifth FET 24a is connected at the gate to an input terminal IN. The drain of the fifth FET 24a is connected to a power supply Vdd. The source of the fifth FET 24a is connected to the drain of a sixth FET 24e and the gate of the first FET 21a through diodes 24b, 24c and 24d. The diodes 24b, 24c and 24d are serially connected forwardly in the input level shifter 24. The number of diodes 24b, 24c and 24d is determined so that the voltage drop thereof is almost identical to a required source-drain voltage of the first FET 21a. The gate and source of the sixth FET 24e are grounded. The input level shifter 24 functions to shift the voltage at the input terminal IN by an amount corresponding to the voltage drop of the diodes 24b, 24c and 24d.

The source of a second FET 21b is connected through a feedback resistor 23a to the gate of the fifth FET 24a. The anode of a diode 23b is connected to the gate of the fifth FET 24a. The other structure is the same as the second preferred embodiment, shown in FIG. 4.

The feedback amplifier 20B is different in operation from the second preferred embodiment, shown in FIG. 4, as follows:

In general, for stable operation of an FET, a sufficient source-drain voltage is required. In addition, for smooth operation of an amplifier, the internal voltage has to be determined at an optimum level. In the embodiment, using the input level shifter 24, the voltage at both ends, input and output, of the feedback resistor 23a is determined to be higher than that in the case of FIG. 4. Thus, the drain voltage goes up and the source-drain voltage of the fourth FET 22d goes up. Therefore, the fourth FET 22d operates in stable condition. Further, a voltage at each portion in the feedback amplifier 20B goes down, so that the supply voltage Vdd can be set to lower level.

In the feedback amplifier 20B, the supply voltage Vdd meets the following formula (4). When comparing the formulas (2) and (3), it is clear that the supply voltage Vdd can be decreased by a level corresponding to the voltage drop of the resistor 22e. The feedback amplifier 20B can operate with a supply voltage that is lower than the supply voltage used in FIG. 4.

Vdd>(Vds of FET 24e)+(Vds of FET 21a)+(Vds of FET 21b)+ Output Amplitude  (4)

As described above, according to the third preferred embodiment, the input level shifter 24 is provided at the input side of the feedback amplifier 20A of the second preferred embodiment, shown in FIG. 4, so that the supply voltage Vdd can be set lower than that in the feedback amplifier 20A; and therefore, the feedback amplifier 20B of this embodiment can operate with a lower supply voltage.

The invention is not limited by the above described embodiments, and a variety of modifications can be applied. Examples of the modifications are as follows:

(a) In each embodiment, the output voltage is taken out from the output terminal OUT, however, the output voltage can be taken out from other portions, such as the cathode of the diode 22b.

(b) In the third embodiment, the feedback resistor 23a is connected at one end to the source of the second FET 21b, however, it can be connected to the source of the third FET 22a.

(c) In each of the feedback amplifiers 20, 20A and 20B, the reverse polarity of elements can be used. In this case, the cathode and anode of the photodiode PD would be connected to a negative power supply and the input terminal IN, respectively.

(d) The invention is applicable to any kinds of feedback amplifiers, such as a sensor, in which an input current supplied from a current source is converted into a voltage.

It will be understood that the above description of the present invention is susceptible to various modifications, changes and adaptations, and the same are intended to be comprehended with the meaning and range of equivalents of the appended claims.

What is claimed is:

1. A feedback amplifier, comprising:

an input terminal where an input voltage is detected from an input current;

an amplifier circuit operable to amplify the input voltage to generate an output signal;

a first output terminal from which the output signal is outputted;

a second output terminal;

a feedback circuit including a feedback resistor connected between said input terminal and said first output terminal, and a diode connected between said input terminal and said second output terminal in parallel with said feedback resistor, said diode being forward-biased; and an output level shifter operable to shift the level of the output signal to generate a shifted output signal supplied to said second output terminal so as to apply a forward voltage to said diode even when the input current is zero, wherein the output signal is feedback-controlled in response to the product of the input current and the impedance of the feedback circuit.

2. The feedback amplifier, according to claim 1, for use with a power supply, wherein said amplifier circuit comprises a first transistor, including a gate connected to said input terminal, a source connected to ground, and a drain; and a second transistor, including a gate and a source both connected to said drain of said first transistor, and a drain connected to the power supply, and said output level shifter comprises a third transistor including a gate connected to said gate and source of said second transistor, and a drain connected to the power supply; a resistor connected at one end of said resistor to said first output terminal, and at the other end of said resistor to said second output terminal; a fourth transistor including a gate and a source both connected to ground, and a drain connected to said second output terminal; and a couple of diodes serially connected in a forward direction between said source of said third transistor and said first output terminal.

3. The feedback amplifier, according to claim 1, further comprising:

an input level shifter connected between said input terminal and said amplifier circuit operable to shift the input voltage to a predetermined level, wherein said amplifier circuit is operable to amplify the shifted input voltage.

4. The feedback amplifier, according to claim 3, wherein said input level shifter comprises a fifth transistor including a gate connected to said input terminal, and a drain connected to the power supply; a sixth transistor including a gate and a source both connected to ground, and a drain connected to said gate of said first transistor; and three diodes serially connected in a forward direction between said source of said fifth transistor and said drain of said sixth transistor.

5. An optical receiver, comprising:

a photodiode operable to detect an input light signal to generate an input current; and a feedback type pre-amplifier including (1) an input terminal where an input voltage is detected from the input current, (2) an amplifier circuit operable to amplify the input voltage to generate an output signal, (3) a first output terminal from which the output signal is outputted, (4) a second output terminal, (5) a feedback circuit including a feedback resistor connected between said input terminal and said first output terminal, and a diode connected in parallel with said feedback resistor between said input terminal and said second output terminal, said diode being forward-biased, and (6) an output level shifter operable to shift the level of the output signal to generate a shifted output signal supplied to said second output terminal so as to apply a forward voltage to said diode even when the input current is zero, wherein the output signal is feedback-controlled in response to the product of the input current and the impedance of the feedback circuit.

6. The optical receiver, according to claim 5, for use with a power supply, wherein said amplifier circuit comprises a first transistor, including a gate connected to said input terminal, a source connected to ground, and a drain; and a second transistor, including a gate and a source both connected to said drain of said first transistor and a drain connected to the power supply, and said output level shifter comprises a third transistor including a gate connected to said gate and source of said second transistor, and a drain connected to the power supply; a resistor connected at one end of said resistor to said first output terminal, and at the other end of said resistor to said second output terminal; a fourth transistor including a gate and a source both connected to ground and a drain connected to said second output terminal; and a couple of diodes serially connected in a forward direction between said source of said third transistor and said first output terminal.

7. The optical receiver, according to claim 5, wherein said pre-amplifier further comprises an input level shifter connected between said input terminal and said amplifier circuit to shift the input voltage to a predetermined level, and said amplifier circuit is operable to amplify the shifted input voltage.

8. The optical receiver, according to claim 7, wherein said input level shifter comprises a fifth transistor including a gate connected to said input terminal, and a drain connected to the power supply; a sixth transistor including a gate and a source both connected to ground, and a drain connected to said gate of said first transistor; and three diodes serially connected in a forward direction between said source of said fifth transistor and said drain of said sixth transistor.

* * * * *